United States Patent
Oonishi et al.

(10) Patent No.: US 9,223,212 B2
(45) Date of Patent: Dec. 29, 2015

(54) PHOTOSENSITIVE RESIN COMPOSITION AND CURED PRODUCT THEREOF

(75) Inventors: Misato Oonishi, Tokyo (JP); Shinya Inagaki, Tokyo (JP); Naoko Imaizumi, Tokyo (JP); Nao Honda, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 46 days.

(21) Appl. No.: 14/234,199

(22) PCT Filed: Jul. 26, 2012

(86) PCT No.: PCT/JP2012/068916
§ 371 (c)(1),
(2), (4) Date: Jan. 22, 2014

(87) PCT Pub. No.: WO2013/018635
PCT Pub. Date: Feb. 7, 2013

(65) Prior Publication Data
US 2014/0186765 A1    Jul. 3, 2014

(30) Foreign Application Priority Data
Jul. 31, 2011    (JP) ................................. 2011-167877

(51) Int. Cl.
G03F 7/038    (2006.01)
C08G 59/42    (2006.01)
G03F 7/40    (2006.01)

(52) U.S. Cl.
CPC ............... *G03F 7/038* (2013.01); *C08G 59/42* (2013.01); *G03F 7/40* (2013.01)

(58) Field of Classification Search
None
See application file for complete search history.

(56) References Cited

U.S. PATENT DOCUMENTS

2003/0087189 A1*    5/2003    Takagi et al. .............. 430/280.1
2005/0147918 A1    7/2005    Weber et al.

FOREIGN PATENT DOCUMENTS

| JP | 10-97070 A | 4/1998 |
|---|---|---|
| JP | 2000-214584 A | 8/2000 |
| JP | 2001-19740 A | 1/2001 |
| JP | 2007-518121 A | 7/2007 |
| JP | 2008-1788 A | 1/2008 |
| JP | 2008-26644 A | 2/2008 |
| JP | 2009-185182 A | 8/2009 |
| WO | 2005/067567 A2 | 7/2005 |
| WO | 2008/010521 A1 | 1/2008 |
| WO | 2010/134513 A1 | 11/2010 |

OTHER PUBLICATIONS

International Search Report and Written Opinion mailed Oct. 9, 2012 in corresponding PCT application No. PCT/JP2012/068916.
International Preliminary Report on Patentability mailed Feb. 13, 2014 in corresponding PCT application No. PCT/JP2012/068916.

* cited by examiner

*Primary Examiner* — Cynthia Hamilton
(74) *Attorney, Agent, or Firm* — Nields, Lemack & Frame, LLC

(57) ABSTRACT

An alkali-developing-type photosensitive resin composition comprising: a polycarboxylic acid resin (A) obtained by reacting a polybasic anhydride (c) with a reactant (ab) between a difunctional bisphenol epoxy resin (a) having an epoxy group at both terminals and an epoxy equivalent of 600-1300 g/eq., and a monocarboxylic acid compound (b) having an alcoholic hydroxyl group; an epoxy resin (B) having two or more epoxy groups in a molecule; and a photoacid generator (C), wherein the addition ratio the monocarboxylic acid compound (b) with respect to 1 equivalent of the epoxy group of the epoxy resin (a) is 80 equivalent % or more, and the addition ratio the polybasic anhydride with respect to one equivalent of the primary hydroxyl group of the reactant (ab) is 80 equivalent % or more.

9 Claims, No Drawings

PHOTOSENSITIVE RESIN COMPOSITION AND CURED PRODUCT THEREOF

TECHNICAL FIELD

The present invention relates to an alkali-developing type photosensitive resin composition being excellent in sensitivity and resolution, low in the storage modulus at high temperatures and excellent in joining properties, and a cured product of the resin composition, which are useful in production of MEMS (microelectromechanical system) components, micromachine components, microfluidic components, μ-TAS (micro-total analysis system) components, inkjet printer components, microreactor components, electroconductive layers, LIGA components, molds for micro-injection molding and thermal embossing or stamps thereof, screens or stencils for micro-printing application, MEMS package components, semiconductor package components, BioMEMS and biophotonic devices and printed wiring boards.

BACKGROUND ART

Photolithographically processable resists have recently been used broadly in semiconductor, MEMS and micromachine applications. In such applications, photolithographic processes can be achieved by carrying out patterning exposure on a substrate, and then developing with a developing liquid to thereby selectively remove exposure regions or non-exposure regions. Photolithographically processable resists (photoresists) come in a positive type and a negative type; and the positive type thereof is a type in which exposure portions are dissolved in a developing liquid, and the negative type thereof is a type in which the exposure portions reversely become insoluble. In electropackage applications and MEMS applications as advanced technologies, not only the forming capability of a uniform spin coating film but high aspect ratios, straight sidewall shapes in thick films, high adherence to substrates, and the like are demanded. The aspect ratio used here is an important property calculated from a resist film thickness/a pattern line width and indicating the performance of photolithography.

As such a photoresist, a negative chemically-amplified photoresist composition is known which is composed of a polyfunctional bisphenol A novolac epoxy resin (trade name: EPON SU-8 Resin, made by Resolution Performance Products LLC) and a photoacid generating agent (which is composed of a propylene carbonate solution of an aromatic sulfonium hexafluoroantimonate) such as CPI 6974 made by ACETO Corporate USA. The photoresist composition, because of having very low light absorption in the wavelength region of 350 to 450 nm, is known as a photoresist composition capable of being processed by thick-film photolithography. The photoresist composition is applied on various types of substrates by spin coating method, curtain coating method, or the like, thereafter baked to volatilize the solvent to thereby form a solid photoresist layer having a thickness of 100 μm or more, and further irradiated with near-ultraviolet light through a photomask by using one of various types of exposure methods such as contact exposure, proximity exposure, and projection exposure to be thereby subjected to a photolithographic processing. Then, the resultant is immersed in a developing liquid to thereby dissolve the non-exposure region, whereby high-resolution negative images of the photomask can be formed on the substrates.

On the other hand, in the fields of MEMS components, MEMS and semiconductor packages and the like, physical properties of package materials are known to affect the reliability of devices. MEMS devices and semiconductor devices are liable to be deteriorated in the properties by changes of the surrounding temperature and humidity and the influences by fine litters and dusts and to be damaged due to the subjection to mechanical vibrations and impacts. In order to protect MEMS and semiconductor devices from these external factors, the devices are provided for use in a form of being sealed with various types of materials, or in a form of being included in a cavity structure surrounded by an external wall of various types of materials, that is, as a package. In the cases of hermetic sealing methods using metals and ceramics as materials for sealants and external walls, although obtained packages are excellent in reliability, these have drawbacks of high production costs, poor dimensional accuracy and the like. By contrast, in the case of resin sealing using resins as materials for sealants and external walls, such a process has relatively low production costs and high dimensional accuracy, but has problems with moisture resistance, heat resistance and the like. For example, the exfoliation of a sealant from a substrate or a device by moisture absorbed from the external environment by a resin material, and the fault caused by outgases generated from a package in exposure to a high-temperature environment pose problems. When an adherend such as a glass or silicon substrate is joined on a cavity provided using a resin material, slight unevenness cannot be filled because the storage modulus of the resin is high, and there resultantly arises a problem such as generating voids in the interior of and on the outer periphery of the substrate. Further in recent years, due to the safety, the influence on human bodies, and the like, a resin material capable of being developed with an alkali and satisfying a high aspect ratio has been demanded.

Patent Literature 1 discloses that a photosensitive resin composition containing a polycarboxylic acid resin obtained by adding an alcoholic hydroxyl group-containing monocarboxylic acid compound to an epoxy group in an addition ratio of 50%, and further carboxylic acid-modifying the resultant with a polybasic acid anhydride is capable of being developed with an alkali. However, there is no description that an alkali-developing type photosensitive resin composition containing a polycarboxylic acid resin obtained by adding an alcoholic hydroxyl group-containing monocarboxylic acid compound to an epoxy group in an addition ratio of 80% or higher, and further carboxylic acid-modifying the resultant is excellent in sensitivity, alkali developability and resolution, and a cured product of the composition has a low storage modulus.

Patent Literature 2 discloses that an anionic electrodeposition coating composition excellent in coating stability can be obtained by adding as an additive an epoxy resin obtained by reacting an epoxy group with an aliphatic monocarboxylic acid or a carboxyl group-containing epoxy resin obtained by introducing a carboxyl group to part of hydroxyl groups of the epoxy resin; however, there is no mention of the alkali developability and joining property of the compositions.

CITATION LIST

Patent Literature

Patent Literature 1: JP 2001-19740 A
Patent Literature 2: JP 2008-1788 A

SUMMARY OF INVENTION

Technical Problem

In the fields of MEMS components, MEMS and semiconductor packages and the like, when a glass or silicon substrate is joined on a substrate coated with a resist, slight unevenness cannot be filled because of a high storage modulus of the resin composition at the joining temperature, and there resultantly arises a problem of generating voids in the interior of and on the outer periphery of the substrate. The present invention has been achieved in consideration of the above-mentioned situations, and has an object to provide an alkali-developing type photosensitive resin composition being excellent in sensitivity and resolution, and having a low storage modulus not generating voids in the interior of and on the outer periphery of a substrate when the adherend such as a glass or silicon substrate is joined; and a cured product of the resin composition.

Solution to Problem

As a result of exhaustive studies, the present inventors have found that an alkali-developing type photosensitive resin composition, which is in a combination of a polycarboxylic acid resin obtained by introducing a hydroxyl group by an alcoholic hydroxyl group-containing carboxylic acid to an epoxy group of a bisphenol epoxy resin having epoxy groups at both terminals thereof, and further carboxylic acid-modifying the resultant, an epoxy resin having two or more epoxy groups in one molecule thereof, and a photoacid generating agent, can solve the above-mentioned problem.

That is, the present invention relates to:

(1) an alkali-developing type photosensitive resin composition, comprising: a polycarboxylic acid resin (A) obtained by reacting a reaction product (ab) of a bifunctional bisphenol epoxy resin (a) having epoxy groups at both terminals thereof and having an epoxy equivalent of 600 to 1,300 g/eq. with a monocarboxylic acid compound (b) having an alcoholic hydroxyl group, with a polybasic acid anhydride (c); an epoxy resin (B) having two or more epoxy groups in one molecule thereof; and a photoacid generating agent (C), wherein the addition ratio of the monocarboxylic acid compound (b) to 1 equivalent of the epoxy group of the epoxy resin (a) is 80 equivalent % or higher; and the addition ratio of the polybasic acid anhydride to 1 equivalent of a primary hydroxyl group of the reaction product (ab) is 80 equivalent % or higher;

(2) the alkali-developing type photosensitive resin composition according to the above (1), wherein the epoxy resin (a) is of a bisphenol A type or F type;

(3) the alkali-developing type photosensitive resin composition according to the above (1) or (2), wherein the monocarboxylic acid compound (b) is dimethylolpropionic acid or dimethylolbutanoic acid;

(4) the alkali-developing type photosensitive resin composition according to any one of the above (1) to (3), wherein the polybasic acid anhydride (c) is one or two or more selected from the group consisting of phthalic anhydride, succinic anhydride, tetrahydrophthalic anhydride, hexahydrophthalic anhydride and maleic anhydride;

(5) the alkali-developing type photosensitive resin composition according to any one of the above (1) to (4), wherein the polycarboxylic acid resin (A) has a solid content acid value of 90 to 105 mgKOH/g;

(6) the alkali-developing type photosensitive resin composition according to any one of the above (1) to (5), wherein the epoxy resin (B) is a bifunctional epoxy resin having epoxy groups at both terminals thereof;

(7) a dry film resist, comprising an alkali-developing type photosensitive resin composition according to any one of the above (1) to (6); and (8) a cured product of an alkali-developing type photosensitive resin composition according to any one of the above (1) to (6), or of a dry film resist according to the above (7).

Advantageous Effects of Invention

The photosensitive resin composition according to the present invention has characteristics of having good image resolution, thermal stability, chemical resistance and solvent solubility, being high in sensitivity, being low in the storage modulus at high temperatures, and being excellent in joining properties. Because voids are not generated in the interior of and on the outer periphery of a substrate when the adherend such as a glass or silicon substrate is joined, the resin composition is suitably used as a photosensitive resin composition for wafer level packages.

DESCRIPTION OF EMBODIMENTS

Hereinafter, the present invention will be described.

The alkali-developing type photosensitive resin composition according to the present invention (hereinafter, also referred to simply as "photosensitive resin composition") contains a polycarboxylic acid resin (A) obtained by reacting a reaction product (ab) of a bifunctional bisphenol epoxy resin (a) (hereinafter, also referred to simply as "epoxy resin (a)") having epoxy groups at both terminals thereof and having an epoxy equivalent of 600 g/eq. or higher with a monocarboxylic acid compound (b) (hereinafter, also referred to simply as "compound (b)") having an alcoholic hydroxyl group in a specific amount or more, with a polybasic acid anhydride (c) in a specific amount or more; an epoxy resin (B) (hereinafter, also referred to simply as "epoxy resin (B)") having two or more epoxy groups in one molecule thereof; and a photoacid generating agent (C). Since the photosensitive resin composition has a low storage modulus at high temperatures, an adherend such as a glass or silicon substrate can be joined without generating voids in the interior of and on the outer periphery of the substrate.

Examples of the epoxy resin (a) as a raw material of the polycarboxylic acid resin (A) contained in the alkali-developing type photosensitive resin composition according to the present invention include bifunctional bisphenol epoxy resins having epoxy groups at both terminals thereof such as bisphenol A epoxy resins, bisphenol F epoxy resins, bisphenol S epoxy resins and bisphenol I epoxy resins. Among them, and bisphenol A epoxy resins or bisphenol F epoxy resins are preferable.

The epoxy equivalent of these epoxy resins (a) is usually 600 to 1,300 g/eq., preferably 700 to 1,200 g/eq., and more preferably 800 to 1,100 g/eq. In the case where the epoxy equivalent is lower than 600 g/eq., portions intrinsically to be cured by exposure have a risk of dissolving in an alkali solution; and in the case where the epoxy equivalent exceeds 1,300 g/eq., portions intrinsically to be dissolved in an alkali solution have a risk of becoming insoluble in an alkali solution. The epoxy equivalent referred to herein is a value measured according to JIS K-7236.

Specific examples of the epoxy resin (a) having the epoxy equivalent include bisphenol A epoxy resins such as jER1003 and jER1004 (made by Mitsubishi Chemical Corporation) and bisphenol F epoxy resins such as jER4004P and jER4005P (made by Mitsubishi Chemical Corporation).

Examples of the compound (b) as a raw material of the polycarboxylic acid resin (A) contained in the photosensitive resin composition according to the present invention include monomethylolpropionic acid, dimethylolpropionic acid, monomethylolbutanoic acid and dimethylolbutanoic acid. Dimethylolpropionic acid and dimethylolbutanoic acid are preferable because many alcoholic hydroxyl groups reactive with a polybasic acid anhydride (c) described later can be introduced into the reaction product (ab) obtained by reacting an epoxy group of the epoxy resin (a) with the compound (b). The compound (b) may be used singly or as a mixture of two or more.

The reaction of the epoxy resin (a) with the compound (b) is usually carried out in a solvent having no hydroxy group. Examples of the solvent include ketones such as acetone, ethyl methyl ketone and cyclohexanone, aromatic hydrocarbons such as benzene, toluene, xylene and tetramethylbenzene, glycol ethers such as ethylene glycol dimethyl ether, ethylene glycol diethyl ether, dipropylene glycol dimethyl ether and dipropylene glycol diethyl ether, esters such as ethyl acetate, butyl acetate, butyl cellosolve acetate, carbitol acetate, propylene glycol monomethyl ether acetate and γ-butyrolactone, alcohols such as methanol, ethanol, cellosolve and methyl cellosolve, aliphatic hydrocarbons such as octane and decane, and petroleum-based solvents such as petroleum ether, petroleum naphtha, hydrogenated petroleum naphtha and solvent naphtha. For the reaction of the epoxy resin (a) with the compound (b), a catalyst is preferably used in order to promote the addition reaction. Specific examples of the catalyst include triethylamine, benzyldimethylamine, triethylammonium chloride, benzyltrimethylammonium bromide, benzyltrimethylammonium iodide, triphenylphosphine, triphenylstibine, chromium octanoate and zirconium octanoate. The amount of the catalyst used is usually 0.1 to 10 mass % to the total of the epoxy resin (a) and the compound (b). The reaction temperature is usually 60 to 150° C., and the reaction time is usually 5 to 60 hours.

The addition ratio of the compound (b) in the addition reaction of an epoxy group of the epoxy resin (a) with a carboxyl group of the compound (b) is usually 80 equivalent % or higher, preferably 90 equivalent % or higher, and more preferably 100 equivalent %, with respect to 1 equivalent of the epoxy group of the epoxy resin (a). In the case where the addition ratio is lower than 80 equivalent %, since the amount of an alcoholic hydroxyl group introduced into the reaction product (ab) is small, the amount of a polybasic acid anhydride (c) added to the reaction product (ab) becomes small and there arises a risk of reducing the alkali developability.

Examples of the polybasic acid anhydride (c) as a raw material of the polycarboxylic acid resin (A) contained in the photosensitive resin composition according to the present invention include succinic anhydride, phthalic anhydride, tetrahydrophthalic anhydride, hexahydrophthalic anhydride, maleic anhydride, trimellitic anhydride and pyromellitic anhydride. Preferable are succinic anhydride, phthalic anhydride, tetrahydrophthalic anhydride, hexahydrophthalic anhydride and maleic anhydride, and more preferable is tetrahydrophthalic anhydride. The polybasic acid anhydride (c) may be used singly or as a mixture of two or more. The addition reaction of the reaction product (ab) obtained in the above with the polybasic acid anhydride (c) can be carried out only by adding an appropriate amount of the polybasic acid anhydride to a solution containing the reaction product (ab) and heating the mixture. The reaction temperature is usually 60 to 150° C., and the reaction time is usually 5 to 10 hours.

The addition ratio of a polybasic acid anhydride (c) in the addition reaction is usually 80 equivalent % or higher, preferably 90 equivalent % or higher, and more preferably 100 equivalent %, with respect to 1 equivalent of a primary hydroxyl group of the reaction product (ab). In the case where the addition ratio is lower than 80 equivalent %, the amount of a carboxylic acid produced by the addition reaction becomes small and there arises a risk of reducing the alkali developability. The polycarboxylic acid resin (A) thus obtained preferably has a solid content acid value of 90 to 105 mgKOH/g.

The epoxy resin (B) contained in the alkali-developing type photosensitive resin composition according to the present invention is not especially limited for use as long as being an epoxy resin having two or more epoxy groups in one molecule thereof, but is preferably a bifunctional epoxy resin having epoxy groups at both terminals thereof, more preferably a bisphenol epoxy resin, and especially preferably a bisphenol A epoxy resin or a bisphenol F epoxy resin, in a sense that the storage modulus of a cured product thereof decreases. Specific examples of the epoxy resin (B) include the same as the specific examples of the epoxy resin (a).

The photoacid generating agent (C) contained in the alkali-developing type photosensitive resin composition according to the present invention is a compound which generates cations that can become a polymerization initiator, by irradiation of ultraviolet rays, far ultraviolet rays, an excimer laser of KrF, ArF or the like, a radiation such as X rays and electron beams, and is usually called also an energy ray-sensitive acid generating agent. Examples of the photoacid generating agent (C) include aromatic iodonium complex salts and aromatic sulfonium complex salts. Among these, specific examples of the aromatic iodonium complex salts include diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, tolylcumyliodonium tetrakis(pentafluorophenyl)borate (made by Rhodia Chemie N.V., trade name: Rhodosil Photoinitiator 2074), and di(4-tertiary butyl)iodonium tris(trifluoromethanesulfonyl)methanide (made by BASF Japan Ltd., trade name: CGI BBIC C1). Specific examples of suitably usable aromatic sulfonium complex salts are 4-thiophenyldiphenylsulfonium hexafluoroantimonate (made by San-Apro Ltd., trade name: CPI-101A), thiophenyldiphenylsulfonium tris(pentafluoroethyl)trifluorophosphate (made by San-Apro Ltd., trade name: CPI-210S), 4-{4-(2-chlorobenzoyl)phenylthio}phenylbis(4-fluorophenyl)sulfonium hexafluoroantimonate (made by Adeka Corp., trade name: SP-172), a mixture of aromatic sulfonium hexafluoroantimonates containing 4-thiophenyldiphenylsulfonium hexafluoroantimonate (made by ACETO Corporate USA, trade name: CPI 6976), triphenylsulfonium tris(trifluoromethanesulfonyl)methanide (made by BASF Ltd., trade name: CGI TPS C1), tris[4-(4-acetylphenyl)sulfonylphenyl]sulfonium tris(trifluoromethyl)sulfonyl)methide (made by BASF Ltd., trade name: GSID26-1), and tris[4-(4-acetylphenyl)sulfonylphenyl]sulfonium tetrakis(2,3,4,5,6-pentafluorophenyl)borate (made by BASF Ltd., trade name: PAG-290). Among the above photoacid generating agents, aromatic sulfonium complex salts are preferable from the viewpoint of the thermal stability for the present invention; and among the aromatic sulfonium complex salts, more preferable are non-antimony-based ones such as thiophenyldiphenylsulfonium tris(pentafluoroethyl)trifluorophosphate, tris[4-(4-acetylphenyl)sulfonylphenyl]sulfonium tris(trifluoromethylsulfonyl)methide and tris[4-(4-acetylphenyl)sulfonylphenyl]sulfonium tetrakis(2,3,4,5-6-pentafluorophenyl)borate.

The blend proportion of components of the alkali-developing type photosensitive resin composition according to the present invention will be described below.

The photosensitive resin composition according to the present invention contains, when the total of the polycarboxylic acid resin (A) and the epoxy resin (B) is taken to be 100 parts by mass, preferably 30 to 70 parts by mass of the polycarboxylic acid resin (A) and 70 to 30 parts by mass of the epoxy resin (B), and more preferably 40 to 60 parts by mass of the polycarboxylic acid resin (A) and 60 to 40 parts by mass of the epoxy resin (B). The photosensitive resin composition according to the present invention contains, with respect to 100 parts by mass of the total of the polycarboxylic acid resin (A) and the epoxy resin (B), preferably 0.5 to 5 parts by mass of the photoacid generating agent (C), and more preferably 1.0 to 2.0 parts by mass thereof. In the case where the molar absorption coefficient at wavelengths of 300 to 380 nm of the photoacid generating agent (C) is high, the content thereof is required to be suitably regulated depending on the thickness of a film to be formed from the photosensitive resin composition.

In order to decrease the viscosity of the alkali-developing type photosensitive resin composition according to the present invention and to improve the film coatability thereof, a solvent (D) can be used in the resin composition. The solvent is an organic solvent usually used for inks, coatings, and the like, and is not especially limited as long as being capable of dissolving components of the photosensitive resin composition. Specific examples of the solvent (D) include ketones such as acetone, ethyl methyl ketone, cyclohexanone, and cyclopentanone, aromatic hydrocarbons such as toluene, xylene, and tetramethylbenzene, glycol ethers such as dipropylene glycol dimethyl ether and dipropylene glycol diethyl ether, esters such as ethyl acetate, butyl acetate, butyl cellosolve acetate, carbitol acetate, propylene glycol monomethyl ether acetate, and γ-butyrolactone, alcohols such as methanol, ethanol, cellosolve, and methyl cellosolve, aliphatic hydrocarbons such as octane and decane, and petroleum-based solvents such as petroleum ethers, petroleum naphthas, hydrogenated petroleum naphthas, and solvent naphthas.

These solvents can be used singly or as a mixture of two or more. The solvent (D) component is added for the purpose of adjusting the film thickness and the coatability when the resin composition is applied on a base material. The amount of the solvent used to reasonably keep the solubility of the main component, the volatility of components, the liquid viscosity of the composition, and the like is preferably 95 mass % or less, and especially preferably 10 to 90 mass %, in the photosensitive resin composition.

For the purpose of improving the adherence of the photosensitive resin composition according to the present invention to a substrate, an adherence imparting agent (F) having miscibility may further be added to the resin composition. As the adherence imparting agent (F), a coupling agent such as a silane coupling agent or a titanium coupling agent can be used. Among them, a silane coupling agent is preferably used.

Examples of the silane coupling agent include 3-chloropropyltrimethoxysilane, vinyltrichlorosilane, vinyltriethoxysilane, vinyltrimethoxysilane, vinyltris(2-methoxyethoxy)silane, 3-methacryloxypropyltrimethoxysilane, 2-(3,4-epoxycyclohexyl)ethyltrimethoxysilane, 3-glycidoxypropyltrimethoxysilane, 3-mercaptopropyltrimethoxysilane, 3-aminopropyltriethoxysilane, N-2-(aminoethyl)-3-aminopropyltrimethoxysilane, and 3-ureidopropyltriethoxysilane. These adherence imparting agents can be used singly or in a combination of two or more.

Since the adherence imparting agent is non-reactive with the main component, part of the adherence imparting agent that does not work at a base material interface may be resultantly present as a residue after curing. Therefore, when used in a large amount, the adherence imparting agent has an adverse influence such as deterioration of physical properties. It is suitable to use the adherence imparting agent in a small amount enough to impart no adverse effect because even a small amount thereof can exhibit the desired effect depending on base materials. The proportion of the adherence imparting agent in the photosensitive resin composition is preferably 15 mass % or less, and especially preferably 5 mass % or less.

For the photosensitive resin composition according to the present invention, a sensitizer may further be used in order to absorb ultraviolet rays and supply the absorbed light energy to the photocationic polymerization initiator. The sensitizer is preferably, for example, thioxanthones and anthracene compounds having alkoxy groups at 9-position and 10-position of anthracene (9,10-dialkoxyanthracene derivatives). Examples of the alkoxy group include C1 to C4 alkoxy groups such as a methoxy group, an ethoxy group, a propoxy group, and a butoxy group. The 9,10-dialkoxyanthracene derivatives may further have substituents. Examples of the substituents include halogen atoms such as a fluorine atom, a chlorine atom, a bromine atom, and an iodine atom, C1 to C4 alkyl groups such as a methyl group, an ethyl group, and a propyl group, alkyl sulfonate ester groups and alkyl carboxylate ester groups. Examples of the alkyls in the alkyl sulfonate ester groups and the alkyl carboxylate ester groups include C1 to C4 alkyls such as methyl, ethyl, and propyl. The substitution position of these substituents is preferably 2-position.

Specific examples of the thioxanthones include 2,4-dimethylthioxanthone, 2,4-diethylthioxanthone, 2-chlorothioxanthone, and 2,4-diisopropylthioxanthone. Preferred examples thereof include 2,4-diethylthioxanthone (trade name: Kayacure DETX-S, made by Nippon Kayaku Co., Ltd.) and 2-isopropylthioxanthone.

Examples of the 9,10-dialkoxyanthracene derivatives include 9,10-dimethoxyanthracene, 9,10-diethoxyanthracene, 9,10-dipropoxyanthracene, 9,10-dibutoxyanthracene, 9,10-dimethoxy-2-ethylanthracene, 9,10-diethoxy-2-ethylanthracene, 9,10-dipropoxy-2-ethylanthracene, 9,10-dimethoxy-2-chloroanthracene, 9,10-dimethoxyanthracene-2-sulfonic acid methyl ester, 9,10-diethoxyanthracene-2-sulfonic acid methyl ester, and 9,10-dimethoxyanthracene-2-carboxylic acid methyl ester.

These can be used singly or as a mixture of two or more, but 2,4-diethylthioxanthone and 9,10-dimethoxy-2-ethylanthracene are most preferably used. Because the sensitizer component can exhibit the desired effect even in a small amount, the proportion is preferably 30 mass % or less, especially preferably 20 mass % or less with respect to the photoacid generating agent (C).

To the resin composition according to the present invention, an ion catcher may be added to reduce adverse effects by ions originated from the photoacid generating agent (C) if necessary. Specific examples of the ion catcher include alkoxyaluminums such as trismethoxyaluminum, trisethoxyaluminum, trisisopropoxyaluminum, isopropoxydiethoxyaluminum, and trisbutoxyaluminum, phenoxyaluminums such as trisphenoxyaluminum and trispara-methylphenoxyaluminum, and organoaluminum compounds such as trisacetoxyaluminum, trisstearatoaluminum, trisbutyratoaluminum, trispropionatoaluminum, trisacetylacetonatoaluminum, tristrifluoroacetylacetonatoaluminum, trisethylacetoacetatoaluminum, diacetylacetonatodipivaloylmethanatoaluminum, and diisopropoxy(ethylacetoacetato)aluminum. These components can be used singly or in a combination of two or more. The amount thereof blended may be 10 mass % or less with respect to the total of (A) the polycarboxylic acid resin, (B) the epoxy resin, and (C) the photoacid generating agent.

For the photosensitive resin composition according to the present invention, as required, various types of additives, such as a thermoplastic resin, a coloring agent, a thickener, a defoaming agent, and a leveling agent, can be used. Examples of the thermoplastic resin include polyether sulfones, polystyrenes, and polycarbonates. Examples of the coloring agent include Phthalocyanine Blue, Phthalocyanine Green, Iodine Green, Crystal Violet, titanium oxide, carbon black, and naphthalene black. Examples of the thickener include Orben, Benton, and montmorillonite. Examples of the defoaming agent include silicone-, fluorine-, and polymer-based defoaming agents. In the case of using these additives, the amounts thereof used are, for example, each 30 mass % or less as a sort of measure in the photosensitive resin composition according to the present invention, but can suitably be varied according to the use purposes.

For the photosensitive resin composition according to the present invention, inorganic fillers can be used, such as barium sulfate, barium titanate, silicon oxide, amorphous silica, talc, clay, magnesium carbonate, calcium carbonate, aluminum oxide, aluminum hydroxide, and mica powder. The amount thereof used may be 60 mass % or less in the photosensitive resin composition according to the present invention.

The alkali-developing type photosensitive resin composition according to the present invention is prepared by mixing and stirring a polycarboxylic acid resin (A), an epoxy resin (B) and a photoacid generating agent (C) as essential components, and as required, a solvent, an adherence imparting agent, a sensitizer, an ion catcher, a thermoplastic resin, a coloring agent, a thickener, a defoaming agent, a leveling agent, an inorganic filler and the like as optional components, by a usual method. When mixing and stirring, a dispersing machine such as a dissolver, a homogenizer, or a three-roll mill may be used as required. The components may further be filtered using a mesh, a membrane filter, or the like after the mixing.

The photosensitive resin composition according to the present invention is used preferably in a liquid form. The photosensitive resin composition according to the present invention is applied, for example, on a metal substrate of silicon, aluminum, copper, or the like, a ceramic substrate of lithium tantalate, glass, silicon oxide, silicon nitride, or the like, or a substrate of polyimide, polyethylene terephthalate, or the like, in a thickness of 0.1 to 1,000 μm by using a spin coater or the like, and subjected to a heat treatment at 60 to 130° C. for about 5 to 60 minutes to remove the solvent thereby forming a photosensitive resin composition layer. Then, a mask having a predetermined pattern is placed on the photosensitive resin composition layer; and the photosensitive resin composition layer is irradiated with ultraviolet rays, and subjected to a heat treatment at 50 to 130° C. for about 1 to 50 minutes; and thereafter, unexposed portions are developed under the conditions of room temperature to 50° C. and about 1 to 180 minutes by using an alkaline developing liquid thereby forming a pattern. Finally, the resultant is subjected to a heat treatment on a condition of 130 to 200° C. so as to obtain a permanent protective film satisfying the required properties. As a developing liquid, for example, a 2.38% tetramethylammonium hydroxide aqueous solution or a 1% sodium carbonate solution can be used. The development may use a development apparatus of a paddle type, a spray type, a shower type, or the like, and as required, ultrasonic irradiation may be carried out. A preferable metal substrate in use of the photosensitive resin composition according to the present invention includes aluminum.

The photosensitive resin composition according to the present invention can be used also as a dry film resist. The dry film resist can be obtained, for example, by applying the photosensitive resin composition on a base film by using a roll coater, a die coater, a knife coater, a bar coater, a gravure coater or the like, thereafter drying the applied composition in a drying oven set at 45 to 100° C. thereby removing a predetermined amount of a solvent, and as required, laminating a cover film or the like. At this time, the thickness of the resist on the base film is regulated to 2 to 100 μm. The base film and the cover film to be used are, for example, films of polyester, polypropylene, polyethylene, TAC, or polyimide. These films, as required, may be subjected to a mold release treatment with a silicone-based mold release agent, a non-silicone-based mold release agent or the like. The dry film resist can be used, for example, in such a way that the cover film is separated from the resist and the resultant is then transferred to a substrate at a temperature of 40 to 100° C. at a pressure of 0.05 to 2 MPa by a hand roll, a laminator or the like, and exposed, baked after the exposure, developed and heat treated as in the liquid photosensitive resin composition.

If the photosensitive resin composition is supplied as a film, steps of applying the resin composition on a support and drying the applied composition can be omitted, and a pattern formation using the photosensitive resin composition according to the present invention can be made more simply.

When used as MEMS packages and semiconductor packages, the photosensitive resin composition according to the present invention can be used by fabricating a covering or a cavity structure therefrom. For MEMS packages and semiconductor packages, a substrate is used which is, for example, prepared by forming a metal thin film in a film thickness of 10 to 5,000 Å of aluminum, gold, copper, chromium, titanium or the like on a silicon wafer in various shapes by sputtering or vapor deposition, and microprocessing the metal by etching or the like. In some cases, silicon oxide or silicon nitride may further be formed as an inorganic protection film in a film thickness of 10 to 10,000 Å. Then, a MEMS device or a semiconductor device is fabricated or provided on the substrate; and in order to block the device from the outside atmosphere, a covering or a cavity structure needs to be fabricated. In the case of covering with the photosensitive resin composition according to the present invention, the covering can be made by the above-mentioned method. In the case of fabricating the cavity structure, a partition wall is formed on the substrate by the above-mentioned method; and a dry film is further laminated thereon by the above-mentioned method, and a patterning is made so as to make a lid on the partition wall, whereby a cavity package structure can be fabricated. After the fabrication, as required, a heat treatment at 130 to 200° C. for 10 to 120 minutes is carried out thereby obtaining MEMS package components and semiconductor package components satisfying the required properties.

The term "package" herein refers to a sealing method or a sealed structure used for blocking infiltration of gases and liquids of the outside atmosphere in order to keep the stability of substrates, interconnections, devices and the like. The package described in the present invention refers to cavity packages for packaging a structure having a driving section like MEMS and a vibrator such as a SAW device, surface protection, resin sealing and the like made in order to prevent the deterioration of semiconductor substrates, printed wiring boards, interconnections and the like. The term "wafer level package" herein represents a package construction method in which protection film formation, terminal formation, wiring processing and packaging are made in the wafer state, and thereafter, the wafer is cut into chips.

Since the photosensitive resin composition according to the present invention has features of having good image resolution, thermal stability, chemical resistance and solvent solubility, of being low in the storage modulus at high temperatures and of not generating voids in the interior of and on the outer periphery of a substrate when the adherend such as a glass or silicon substrate is joined, the resin composition is utilized, for example, in production of MEMS (microelectromechanical system) components, micromachine components, microfluidic components, μ-TAS (micro-total analysis system) components, inkjet printer components, microreactor components, electroconductive layers, LIGA components, molds for micro-injection molding and thermal embossing or stamps thereof, screens or stencils for microprinting application, MEMS package components, semiconductor package components, BioMEMS and biophotonic devices and printed wiring boards. Among these, the resin composition is useful particularly for MEMS package components and semiconductor package components.

EXAMPLES

Hereinafter, the present invention will be described in more detail by way of Examples, but these Examples are only examples to suitably describe the present invention, and do not limit the present invention any more.

Synthesis Example 1

Synthesis of a Polycarboxylic Acid Resin (A)

429.5 g of cyclopentanone as a reaction solvent, and 868.0 g of jER-4004P (made by Mitsubishi Chemical Corporation, bisphenol F epoxy resin, epoxy equivalent: 868 g/eq.) as the epoxy resin (a) were charged in a 5-L flask, and heated to 120° C. thereby dissolving the resin. 134.1 g of dimethylolpropionic acid as the alcoholic hydroxyl group-containing monocarboxylic acid compound (b) and 1.43 g of triphenylphosphine as a reaction catalyst were added to the resin solution, and heated to 120° C. and reacted for 26 hours. After the confirmation of the acid value of the reaction liquid becoming 7 mgKOH/g or lower, 304.3 g of tetrahydrophthalic anhydride as the polybasic acid anhydride (c) and 272.5 g of cyclopentanone were added thereto, and reacted at 80° C. for 8 hours thereby obtaining a resin solution (A-1) containing 68% (solid content concentration) of the polycarboxylic acid resin (A) of a solid content acid value of 99.6 mgKOH/g.

Synthesis Example 2

Synthesis of a Polycarboxylic Acid Resin (A)

505.8 g of cyclopentanone as a reaction solvent, and 1,070.0 g of jER-4005P (made by Mitsubishi Chemical Corporation, bisphenol F epoxy resin, epoxy equivalent: 1,070 g/eq.) as the epoxy resin (a) were charged in a 5-L flask, and heated to 120° C. thereby dissolving the resin. 134.1 g of dimethylolpropionic acid as the alcoholic hydroxyl group-containing monocarboxylic acid compound (b) and 1.72 g of triphenylphosphine as a reaction catalyst were added to the resin solution, and heated to 120° C. and reacted for 26 hours. After the confirmation of the acid value of the reaction liquid becoming 7 mgKOH/g or lower, 304.3 g of tetrahydrophthalic anhydride as the polybasic acid anhydride (c) and 327.4 g of cyclopentanone were added thereto, and reacted at 80° C. for 8 hours thereby obtaining a resin solution (A-2) containing 67% (solid content concentration) of a polycarboxylic acid resin (A) of a solid content acid value of 98.4 mgKOH/g.

Synthesis Example 3

Synthesis of a Polycarboxylic Acid Resin (A)

500.3 g of cyclopentanone as a reaction solvent, and 950.0 g of jER-1004 (made by Mitsubishi Chemical Corporation, bisphenol A epoxy resin, epoxy equivalent: 950 g/eq.) as the epoxy resin (a) were charged in a 5-L flask, and heated to 120° C. thereby dissolving the resin. 134.1 g of dimethylolpropionic acid as the alcoholic hydroxyl group-containing monocarboxylic acid compound (b) and 1.55 g of triphenylphosphine as a reaction catalyst were added to the resin solution, and heated to 120° C. and reacted for 30 hours. After the confirmation of the acid value of the reaction liquid becoming 7 mgKOH/g or lower, 326.2 g of tetrahydrophthalic anhydride as the polybasic acid anhydride (c) and 294.8 g of cyclopentanone were added thereto, and reacted at 80° C. for 8 hours thereby obtaining a resin solution (A-3) containing 66% (solid content concentration) of a polycarboxylic acid resin (A) of a solid content acid value of 100.8 mgKOH/g.

Synthesis Example 4

Synthesis of a Polycarboxylic Acid Resin (A)

417.9 g of cyclopentanone as a reaction solvent, and 868.0 g of jER-4004P (made by Mitsubishi Chemical Corporation, bisphenol F epoxy resin, epoxy equivalent: 868 g/eq.) as the epoxy resin (a) were charged in a 5-L flask, and heated to 120° C. thereby dissolving the resin. 107.3 g of dimethylolpropionic acid as the alcoholic hydroxyl group-containing monocarboxylic acid compound (b) and 1.39 g of triphenylphosphine as a reaction catalyst were added to the resin solution, and heated to 120° C. and reacted for 20 hours. After the confirmation of the acid value of the reaction liquid becoming 7 mgKOH/g or lower, 243.5 g of tetrahydrophthalic anhydride as the polybasic acid anhydride (c) and 265.2 g of cyclopentanone were added thereto, and reacted at 80° C. for 8 hours thereby obtaining a resin solution (A-4) containing 66% (solid content concentration) of a polycarboxylic acid resin (A) of a solid content acid value of 92 mgKOH/g.

Synthesis Example 5

Synthesis of a Comparative Polycarboxylic Acid Resin

A resin solution (A-5) containing 70% (solid content concentration) of a comparative polycarboxylic acid resin (A) of a solid content acid value of 73.0 mgKOH/g was obtained by using a cresol novolac epoxy resin (10 equivalent), dimethylolpropionic acid (2 mol) and 2.55 mol of tetrahydrophthalic anhydride, and according to the description of the synthesis example 2 in JP 10-097070 A.

Synthesis Example 6

Synthesis of a Comparative Polycarboxylic Acid Resin 429.5 g of cyclopentanone as a reaction solvent, and 868.0 g of jER-4004P (made by Mitsubishi Chemical Corporation, bisphenol F epoxy resin, epoxy equivalent: 868 g/eq.) as the epoxy resin (a) were charged in a 5-L flask, and heated to 120° C. thereby dissolving the resin. 40.2 g of dimethylolpropionic acid as the alcoholic hydroxyl group-containing monocarboxylic acid compound (b) and 1.29 g of triphenylphosphine as a reaction catalyst were added to the resin solution, and heated to 120° C. and reacted for 20 hours. After the confirmation of the acid value of the reaction liquid becoming 7 mgKOH/g or lower, 91.3 g of tetrahydrophthalic anhydride as the polybasic acid anhydride (c) and 246.9 g of cyclopentanone were added thereto, and reacted at 80° C. for 8 hours thereby obtaining a resin solution (A-6) containing 68% (solid content concentration) of a comparative polycarboxylic acid resin (A) of a solid content acid value of 40 mgKOH/g.

Synthesis Example 7

Synthesis of a Comparative Polycarboxylic Acid Resin 400.7 g of cyclopentanone as a reaction solvent, and 868.0 g of jER-4004P (made by Mitsubishi Chemical Corporation, bisphenol F epoxy resin, epoxy equivalent: 868 g/eq.) as the epoxy resin (a) were charged in a 5-L flask, and heated to 120° C. thereby dissolving the resin. 67.1 g of dimethylolpropionic acid as the alcoholic hydroxyl group-containing monocarboxylic acid compound (b) and 1.34 g of triphenylphosphine as a reaction catalyst were added to the resin solution, and heated to 120° C. and reacted for 20 hours. After the confirmation of the acid value of the reaction liquid becoming 7 mgKOH/g or lower, 152.1 g of tetrahydrophthalic anhydride as the polybasic acid anhydride (c) and 254.3 g of cyclopentanone were added thereto, and reacted at 80° C. for 8 hours thereby obtaining a resin solution (A-7) containing 67% (solid content concentration) of a comparative polycarboxylic acid resin (A) of a solid content acid value of 61 mgKOH/g.

Synthesis Example 8

Synthesis of a Comparative Polycarboxylic Acid Resin 500.3 g of cyclopentanone as a reaction solvent, and 160 g of YDF-8170C (made by Nippon Steel Chemical Co., Ltd., bisphenol F epoxy resin, epoxy equivalent: 160 g/eq.) comparatively positioned relevant to the epoxy resin (a) were charged in a 5-L flask, and heated to 100° C. thereby dissolving the resin. 134.1 g of dimethylolpropionic acid as the alcoholic hydroxyl group-containing monocarboxylic acid compound (b) and 0.42 g of triphenylphosphine as a reaction catalyst were added to the resin solution, and heated to 100° C. and reacted for 5 hours. After the confirmation of the acid value of the reaction liquid becoming 7 mgKOH/g or lower, 326.2 g of tetrahydrophthalic anhydride as the polybasic acid anhydride (c) and 294.8 g of cyclopentanone were added thereto, and reacted at 80° C. for 8 hours thereby obtaining a resin solution (A-8) containing 68% (solid content concentration) of a comparative polycarboxylic acid resin (A) of a solid content acid value of 98.2 mgKOH/g.

Synthesis Example 9

Synthesis of a Comparative Polycarboxylic Acid Resin 1008.1 g of cyclopentanone as a reaction solvent, and 2218.0 g of jER-4007P (made by Mitsubishi Chemical Corporation, bisphenol F epoxy resin, epoxy equivalent: 2218 g/eq.) comparatively positioned relevant to the epoxy resin (a) were charged in a 5-L flask, and heated to 120° C. thereby dissolving the resin. 134.1 g of dimethylolpropionic acid as the alcoholic hydroxyl group-containing monocarboxylic acid compound (b) and 3.36 g of triphenylphosphine as a reaction catalyst were added to the resin solution, and heated to 120° C. and reacted for 30 hours. After the confirmation of the acid value of the reaction liquid becoming 7 mgKOH/g or lower, 326.2 g of tetrahydrophthalic anhydride as the polybasic acid anhydride (c) and 594.8 g of cyclopentanone were added thereto, and reacted at 80° C. for 8 hours thereby obtaining a resin solution (A-9) containing 68% (solid content concentration) of a comparative polycarboxylic acid resin (A) of a solid content acid value of 104.2 mgKOH/g.

Synthesis Example 10

Synthesis of a Polycarboxylic Acid Resin 1008.1 g of cyclopentanone as a reaction solvent, and 868.0 g of jER-4004P (made by Mitsubishi Chemical Corporation, bisphenol F epoxy resin, epoxy equivalent: 868 g/eq.) as the epoxy resin (a) were charged in a 5-L flask, and heated to 120° C. thereby dissolving the resin. 134.1 g of dimethylolpropionic acid as the alcoholic hydroxyl group-containing monocarboxylic acid compound (b) and 1.50 g of triphenylphosphine as a reaction catalyst were added to the resin solution, and heated to 120° C. and reacted for 30 hours. After the confirmation of the acid value of the reaction liquid becoming 7 mgKOH/g or lower, 121.7 g of tetrahydrophthalic anhydride as the polybasic acid anhydride (c) and 594.8 g of cyclopentanone were added thereto, and reacted at 80° C. for 8 hours thereby obtaining a resin solution (A-10) containing 70% (solid content concentration) of a comparative polycarboxylic acid resin (A) of a solid content acid value of 80.0 mgKOH/g.

Synthesis Example 11

Synthesis of a Comparative Polycarboxylic Acid Resin 1008.1 g of cyclopentanone as a reaction solvent, and 868.0 g of jER-4004P (made by Mitsubishi Chemical Corporation, bisphenol F epoxy resin, epoxy equivalent: 868 g/eq.) as the epoxy resin (a) were charged in a 5-L flask, and heated to 120° C. thereby dissolving the resin. 134.1 g of dimethylolpropionic acid as the alcoholic hydroxyl group-containing monocarboxylic acid compound (b) and 1.50 g of triphenylphosphine as a reaction catalyst were added to the resin solution, and heated to 120° C. and reacted for 30 hours. After the confirmation of the acid value of the reaction liquid becoming 7 mgKOH/g or lower, 60.9 g of tetrahydrophthalic anhydride as the polybasic acid anhydride (c) and 594.8 g of cyclopentanone were added thereto, and reacted at 80° C. for 8 hours thereby obtaining a resin solution (A-11) containing 68% (solid content concentration) of a comparative polycarboxylic acid resin (A) of a solid content acid value of 50.2 mgKOH/g.

Hereinafter, preparation methods of alkali-developing type photosensitive resin compositions according to Examples 1 to 5 and Comparative Examples 1 to 6 will be described.

(Preparations of Alkali-Developing Type Photosensitive Resin Compositions)

Photosensitive resin compositions according to the present invention and for comparison were each obtained by stirring and mixing the polycarboxylic acid resin (A), the epoxy resin (B), the photoacid generating agent (C) and other components in amounts (unit: parts by mass) described in Table 1 in a flask with a stirrer at 60° C. for 1 hour.

(Patterning of the Photosensitive Resin Compositions)

Each of the photosensitive resin compositions of Examples 1 to 5 and Comparative Examples 1 to 6 was applied on a silicon wafer by a spin coater, and then dried thereby obtaining a photosensitive resin composition layer having a film thickness shown in Table 1 ("film thickness after coating" in Table 1 indicates a film thickness after coating and drying). The photosensitive resin composition layer was pre-baked by a hot plate at 65° C. for 5 minutes and at 95° C. for 15 minutes. Thereafter, the resin composition layer was subjected to a pattern exposure (soft contact, i-line) using an i-line exposing apparatus (mask aligner, made by Ushio Inc.), subjected to post-exposure baking (hereinafter, referred to as "PEB") at 95° C. for 6 minutes by a hot plate, and subjected to a development treatment at 23° C. for 5 minutes by an immersion method using a 2.38% tetramethylammonium hydroxide aqueous solution thereby obtaining a resin pattern cured on the substrate (silicon wafer).

(Evaluation of Alkali Developability of the Photosensitive Resin Compositions)

In the above-mentioned pattern exposure, the solubility of the photosensitive resin compositions to an alkali developing liquid in developing was evaluated according to the following evaluation criteria.

Evaluation Criteria

○: Only unexposed portions were dissolved.

Δ: Exposed portions also were dissolved.

X: Any portion was not dissolved.

(Evaluation of Sensitivity of the Photosensitive Resin Compositions)

In the above pattern exposure, an exposure amount by which the mask transfer accuracy became best was taken to be an optimum exposure amount, and the sensitivity of the each photosensitive resin composition was evaluated. A smaller value of the optimum exposure amount indicates a higher sensitivity. The results are shown in Table 1. A mark "-" in the table indicates that the evaluation of the sensitivity was impossible because unexposed portions were not dissolved, or exposed portions also were dissolved in the above-mentioned evaluation of the alkali develop ability.

(Evaluation of Resolution of the Photosensitive Resin Compositions)

In the pattern exposure using the optimum exposure amount resulted from the above test, the resolution was evaluated by using each of photomasks of 1, 5, 10, and 20 μm in line and space, and measuring the finest pattern width adhered to a substrate in a resist pattern resolved without any residue. The results are shown in Table 1 below. A mark "-" in the table indicates that the evaluation of the sensitivity was impossible because unexposed portions were not dissolved, or exposed portions also were dissolved in the above-mentioned evaluation of the alkali developability.

(Evaluation of Storage Modulus of the Photosensitive Resin Compositions)

The photosensitive resin compositions of Examples 1 to 5 and Comparative Examples 1 to 6 were each applied uniformly on a polyethylene terephthalate (PET) film (made by Teijin Limited), and pre-baked on a hot plate at 65° C. for 5 minutes and at 95° C. for 15 minutes. Thereafter, the applied resin composition was subjected to a whole image exposure treatment (i-line) using an i-line exposing apparatus (mask aligner, made by Ushio Inc.), subjected to a PEB at 95° C. for 6 min by a hot plate, subjected to a development treatment at 23° C. for 5 min by an immersion method using a 2.38% tetramethylammonium hydroxide aqueous solution, dried under nitrogen blow, thereafter cut out by a dumbbell cutter, and baked in an oven at 180° C. for 60 minutes, thereby fabricating a sample for measuring the storage modulus. The storage moduli at from 30° C. to 300° C. of these samples were measured by a dynamic viscoelasticity measurement apparatus (DMS, made by SII Nano Technology Inc.), and the storage moduli at 150° C. were evaluated according to the following evaluation criteria. The results are shown in Table 1 below. Here, the measurement samples were fabricated according to a JIS Standard (JIS K7162).

Evaluation Criteria

A storage modulus at 150° C. was:

○: lower than 5 MPa;

Δ: 5 MPa or higher and lower than 10 MPa; and

X: 10 MPa or higher.

TABLE 1

Evaluation Compositions and Evaluation Results of the Photosensitive Resin Compositions

| Blended Component | | Example | | | | | Comparative Example | | | | | |
|---|---|---|---|---|---|---|---|---|---|---|---|---|
| | | 1 | 2 | 3 | 4 | 5 | 1 | 2 | 3 | 4 | 5 | 6 |
| Polycarboxylic Acid Resin | (A-1) | 60 | | | | | | | | | | |
| | (A-2) | | 60 | | | | | | | | | |
| | (A-3) | | | 60 | | | | | | | | |
| | (A-4) | | | | 60 | | | | | | | |
| | (A-5) | | | | | | 60 | | | | | |
| | (A-6) | | | | | | | 60 | | | | |
| | (A-7) | | | | | | | | 60 | | | |
| | (A-8) | | | | | | | | | 60 | | |
| | (A-9) | | | | | | | | | | 60 | |
| | (A-10) | | | | | 60 | | | | | | |
| | (A-11) | | | | | | | | | | | 60 |
| Epoxy Resin | (B-1) | 10 | 10 | 10 | 10 | 10 | 10 | 10 | 10 | 10 | 10 | 10 |
| | (B-2) | 40 | 40 | 40 | 40 | 40 | 40 | 40 | 40 | 40 | 40 | 40 |
| Photoacid Generating Agent | (C) | 2 | 2 | 2 | 2 | 2 | 2 | 2 | 2 | 2 | 2 | 2 |
| Solvent | (D) | 40 | 40 | 40 | 40 | 40 | 40 | 40 | 40 | 40 | 40 | 40 |
| Leveling Agent | (E) | 0.1 | 0.1 | 0.1 | 0.1 | 0.1 | 0.1 | 0.1 | 0.1 | 0.1 | 0.1 | 0.1 |
| Adherence Imparting Agent | (F) | 2 | 2 | 2 | 2 | 2 | 2 | 2 | 2 | 2 | 2 | 2 |
| Film Thickness (μm) | | 50 | 50 | 50 | 50 | 50 | 50 | 50 | 50 | 50 | 50 | 50 |
| Sensitivity (mJ/cm$^2$) | | 1200 | 1500 | 1200 | 1000 | 1200 | 300 | — | — | 1000 | — | — |

TABLE 1-continued

Evaluation Compositions and Evaluation Results of the Photosensitive Resin Compositions

| Blended Component | Example | | | | | Comparative Example | | | | | |
|---|---|---|---|---|---|---|---|---|---|---|---|
| | 1 | 2 | 3 | 4 | 5 | 1 | 2 | 3 | 4 | 5 | 6 |
| Resolution (μm) | 10 | 20 | 10 | 10 | 10 | 10 | — | — | 10 | — | — |
| Alkali Developability | ○ | ○ | ○ | ○ | ○ | ○ | X | X | ○ | Δ | X |
| Storage Modulus at 150° C. (MPa) | ○ | ○ | ○ | ○ | ○ | X | ○ | ○ | ○ | X | ○ |

With respect to the blended components, (A-1) to (F) in Table 1 each indicate the following.
(A-1): the polycarboxylic acid resin described in Synthesis Example 1
(A-2): the polycarboxylic acid resin described in Synthesis Example 2
(A-3): the polycarboxylic acid resin described in Synthesis Example 3
(A-4): the polycarboxylic acid resin described in Synthesis Example 4
(A-5): the polycarboxylic acid resin described in Synthesis Example 5
(A-6): the polycarboxylic acid resin described in Synthesis Example 6
(A-7): the polycarboxylic acid resin described in Synthesis Example 7
(A-8): the polycarboxylic acid resin described in Synthesis Example 8
(A-9): the polycarboxylic acid resin described in Synthesis Example 9
(B-1): a bisphenol F epoxy resin (trade name: jER4007, made by Mitsubishi Chemical Corporation, epoxy equivalent: 2270 g/eq.)
(B-2): a bisphenol F epoxy resin (trade name: YDF-8170C, made by Nippon Steel Chemical Co., Ltd., epoxy equivalent: 160 g/eq.)
(C): a photoacid generating agent (tris[4-(4-acetylphenyl)sulfonylphenyl]sulfonium tetrakis(2,3,4,5,6-pentafluorophenyl)borate, trade name: PAG290, made by BASF)
(D): a solvent (cyclopentanone, made by Zeon Corporation)
(E): a fluorine-based leveling agent (trade name: Baysilone 3739, made by Bayer AG)
(F): a silane coupling agent (trade name: S-510, Chisso Corp.)

Example 6

A Dry Film Resist Composed of the Photosensitive Resin Composition According to the Present Invention The photosensitive resin composition obtained in the above Example 1 was applied uniformly on a polypropylene (PP) film (base film, made by Toray Industries, Inc.) of 15 μm in thickness, and dried at 65° C. for 5 minutes and at 80° C. for 20 minutes by a hot air convection drier; and a PP film (cover film) of 38 μm in thickness was laminated on the resultant exposed surface, thereby preparing a photosensitive resin composition laminate comprised of a dry film resist of 15 μm in thickness.

(Patterning of the Dry Film Resist)

A step consisting of the following operations was repeated four times: the cover film was peeled off the photosensitive resin composition laminate obtained in the above; the resultant was laminated on a silicon wafer at a roll temperature of 70° C., an air pressure of 0.2 MPa and at a rate of 0.5 m/min; and the base film was peeled off, thereby obtaining a photosensitive resin composition layer of 60 μm. Pattern exposure (soft contact, i-line) was carried out on the photosensitive resin composition layer by an i-line exposing apparatus (mask aligner, made by Ushio Inc.). Thereafter, the resultant was subjected to a PEB at 95° C. for 4 minutes by a hot plate, and subjected to a development treatment at 23° C. for 4 minutes by an immersion method using a 2.38% tetramethylammonium hydroxide aqueous solution, thereby obtaining a resin pattern cured on the substrate. An optimum exposure amount of 500 mJ/cm$^2$ and a fine line tight pattern width of 10 μm were advantageously attained.

INDUSTRIAL APPLICABILITY

The photosensitive resin composition according to the present invention, since holding properties of good image resolution, thermal stability, chemical resistance and solvent solubility, being high in sensitivity, and being low in the storage modulus at high temperatures, is useful for joining an adherend such as a glass or silicon substrate without generating voids, and is suitable particularly for resin molding which is high in dimensional stability and high in durability in the fields of MEMS components, MEMS package components, semiconductor packages and the like.

The invention claimed is:

1. An alkali-developing photosensitive resin composition, comprising: a polycarboxylic acid resin (A) obtained by reacting a reaction product (ab) of a bifunctional bisphenol epoxy resin (a) having epoxy groups at both terminals thereof and having an epoxy equivalent of 600 to 1,300 g/eq. with a monocarboxylic acid compound (b) having an alcoholic hydroxyl group, with a polybasic acid anhydride (c); an epoxy resin (B) having two or more epoxy groups in one molecule thereof; and a photoacid generating agent (C), wherein an addition ratio of the monocarboxylic acid compound (b) to 1 equivalent of the epoxy group of the epoxy resin (a) is 80 equivalent % or higher; and an addition ratio of the polybasic acid anhydride to 1 equivalent of a primary hydroxyl group of the reaction product (ab) is 80 equivalent % or higher, and wherein said monocarboxylic acid compound (b) is at least one member selected from the group consisting of monomethylolpropionic acid, dimethylolpropionic acid, monomethylolbutanoic acid and dimethylolbutanoic acid.

2. The alkali-developing photosensitive resin composition according to claim 1, wherein the epoxy resin (a) is bisphenol A or F.

3. The alkali-developing photosensitive resin composition according to claim 1, wherein the monocarboxylic acid compound (b) is dimethylolpropionic acid or dimethylolbutanoic acid.

4. The alkali-developing photosensitive resin composition according to claim 1, wherein the polybasic acid anhydride (c) is one or two or more selected from the group consisting of phthalic anhydride, succinic anhydride, tetrahydrophthalic anhydride, hexahydrophthalic anhydride and maleic anhydride.

5. The alkali-developing photosensitive resin composition according to claim 1, wherein the polycarboxylic acid resin (A) has a solid content acid value of 90 to 105 mgKOH/g.

6. The alkali-developing photosensitive resin composition according to claim 1, wherein the epoxy resin (B) is a bifunctional epoxy resin having epoxy groups at both terminals thereof.

7. A dry film resist, comprising an alkali-developing photosensitive resin composition according to any one of claims 1 to 6.

8. A cured product of an alkali-developing photosensitive resin composition according to any one of claims 1 to 6.

9. A cured product of a dry film resist according to claim 7.

* * * * *